US006368979B1

United States Patent
Wang et al.

(10) Patent No.: US 6,368,979 B1
(45) Date of Patent: Apr. 9, 2002

(54) PROCESS FOR FORMING TRENCHES AND VIAS IN LAYERS OF LOW DIELECTRIC CONSTANT CARBON-DOPED SILICON OXIDE DIELECTRIC MATERIAL OF AN INTEGRATED CIRCUIT STRUCTURE

(75) Inventors: Zhihai Wang, Sunnyvale; Wilbur G. Catabay, Saratoga; Joe W. Zhao, San Jose, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/607,511

(22) Filed: Jun. 28, 2000

(51) Int. Cl.$^7$ .............................................. H01L 21/00
(52) U.S. Cl. ..................... 438/723; 438/724; 438/725; 438/734; 438/740; 216/79
(58) Field of Search ................................. 438/636, 637, 438/675, 723, 724, 725, 734, 735, 738, 743, 744, 740; 216/67, 79

(56) References Cited

U.S. PATENT DOCUMENTS

| | | | |
|---|---|---|---|
| 3,012,861 A | 12/1961 | Ling | 23/223.5 |
| 3,178,392 A | 4/1965 | Kriner | 260/46.5 |

(List continued on next page.)

FOREIGN PATENT DOCUMENTS

| | | |
|---|---|---|
| DE | 198 04 375 A1 | 7/1999 |
| EP | 0 706 216 A2 | 4/1996 |
| EP | 0 949 663 A2 | 10/1999 |
| JP | 63003437 | 1/1988 |
| JP | 2000-267128 | 9/2000 |
| WO | WO 99/41423 | 8/1999 |

OTHER PUBLICATIONS

Dobson, C.D., et al., "Advanced $SiO_2$ Planarization Using Silane and $H_2O_2$", *Semiconductor International*, Dec. 1994, pp. 85–88.

(List continued on next page.)

Primary Examiner—William A. Powell
(74) Attorney, Agent, or Firm—John P. Taylor, Esq.

(57) ABSTRACT

A dual damascene type of structure of vias and trenches formed using layers of low k dielectric material is disclosed, and a process for making same without damage to the low k dielectric material during removal of photoresist masks used respectively in the formation of the pattern of via openings and the pattern of trench openings in the layers of low k dielectric material. Damage to the low k dielectric material is avoided by forming a first layer of low k dielectric material on an integrated circuit structure; forming a first hard mask layer over the first layer of low k dielectric material; forming over the first hard mask layer a first photoresist mask having a pattern of via openings therein; and then etching the first hard mask layer through the first photoresist mask to form a first hard mask having the pattern of vias openings replicated therein, using an etch system which will also remove the first photoresist mask. The first photoresist mask (the via mask) is, therefore, removed during the formation of the first hard mask, instead of in a separate oxidizing step which would damage the low k dielectric material. Damage to the low k dielectric material during removal of the second photoresist mask (the trench mask) is also avoided by depositing a second layer of low k dielectric material over the first hard mask; forming over the second layer of low k dielectric material a second hard mask layer; forming over the second hard mask layer a second photoresist mask having a pattern of trench openings therein; and then forming the second hard mask by etching the second hard mask layer through the second photoresist resist mask to form a second hard mask having the pattern of trench openings replicated therein, using at etch system which will also remove the second photoresist mask. Thus, the second photoresist mask (the trench mask) is also removed during the formation of the second hard mask, instead of in a separate oxidizing step which would damage the low k dielectric material.

26 Claims, 8 Drawing Sheets

U.S. PATENT DOCUMENTS

| | | | |
|---|---|---|---|
| 3,652,331 A | 3/1972 | Yamazaki | 117/201 |
| 3,832,202 A | 8/1974 | Ritchie | 106/287 |
| 3,920,865 A | 11/1975 | Läufer et al. | 427/220 |
| 4,705,725 A | 11/1987 | Glajch et al. | 428/405 |
| 4,771,328 A | 9/1988 | Malaviya et al. | 357/49 |
| 5,194,333 A | 3/1993 | Ohnaka et al. | 428/405 |
| 5,314,845 A | 5/1994 | Lee et al. | 437/238 |
| 5,364,800 A | 11/1994 | Joyner | 437/28 |
| 5,376,595 A | 12/1994 | Zupancic et al. | 501/12 |
| 5,470,801 A | 11/1995 | Kapoor et al. | 437/238 |
| 5,558,718 A | 9/1996 | Leung | 118/723 E |
| 5,559,367 A | 9/1996 | Cohen et al. | 257/77 |
| 5,580,429 A | 12/1996 | Chan et al. | 204/192.38 |
| 5,628,871 A | 5/1997 | Shinagawa | 438/514 |
| 5,675,187 A | 10/1997 | Numata et al. | 257/758 |
| 5,688,724 A | 11/1997 | Yoon et al. | 437/235 |
| 5,858,879 A | 1/1999 | Chao et al. | 438/725 |
| 5,864,172 A | 1/1999 | Kapoor et al. | 257/634 |
| 5,874,367 A | 2/1999 | Dobson | 438/787 |
| 5,874,745 A | 2/1999 | Kuo | 257/59 |
| 5,882,489 A | 3/1999 | Bersin et al. | 204/192.35 |
| 5,904,154 A | 5/1999 | Chien et al. | 134/1.2 |
| 5,915,203 A | 6/1999 | Sengupta et al. | 438/669 |
| 5,935,868 A * | 8/1999 | Fang et al. | 438/723 X |
| 5,939,763 A | 8/1999 | Hao et al. | 257/411 |
| 6,025,263 A | 2/2000 | Tsai et al. | 438/624 |
| 6,028,015 A | 2/2000 | Wang et al. | 438/789 |
| 6,037,248 A | 3/2000 | Ahn | 438/619 |
| 6,043,167 A | 3/2000 | Lee et al. | 438/789 |
| 6,051,073 A | 4/2000 | Chu et al. | 118/723 |
| 6,051,477 A | 4/2000 | Nam | 438/404 |
| 6,066,574 A | 5/2000 | You et al. | 438/781 |
| 6,114,259 A | 9/2000 | Sukharev et al. | 438/789 |
| 6,147,012 A | 11/2000 | Sukharev et al. | 438/787 |
| 6,153,524 A | 11/2000 | Henley et al. | 438/691 |
| 6,184,142 B1 * | 2/2001 | Chung et al. | 438/723 X |
| 6,204,192 B1 | 3/2001 | Zhao et al. | 438/723 |
| 6,207,576 B1 * | 3/2001 | Wang et al. | 438/723 X |
| 6,232,658 B1 | 5/2001 | Catabay et al. | 257/701 |

OTHER PUBLICATIONS

McClatchie, S., et al., "Low Dielectric Constant Oxide Films Deposited Using CVD Techniques", 1998 Proceedings Fourth International DUMIC Conference, Feb. 16–17, 1998, pp. 311–318.

Peters, Laura, "Pursuing the Perfect Low-k Dielectric", *Semiconductor International,* vol. 21, No. 10, Sep., 1998, pp. 64–66, 68, 70, 72, and 74.

Sugahara, Satoshi, et al., "Chemical Vapor Deposition of $CF_3$–Incorporated Silica Films for Interlayer Dielectric Application", 1999 Joint International Meeting, *Electrochemical Society Meeting Abstracts,* vol. 99–2, 1999, Abstract No. 746.

Koda, Seiichiro, et al., "A Study of Inhibition Effects for Silane Combustion by Additive Gases", *Combustion and Flame,* vol. 73, No. 2, Aug., 1988, pp. 187–194.

* cited by examiner

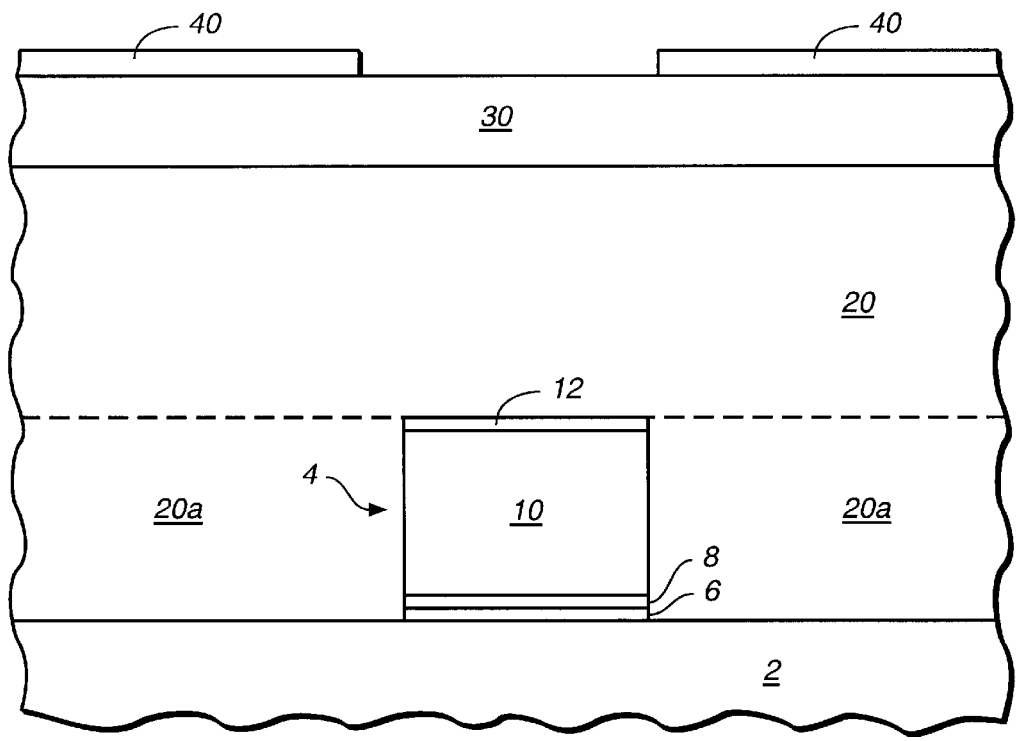
FIG._1
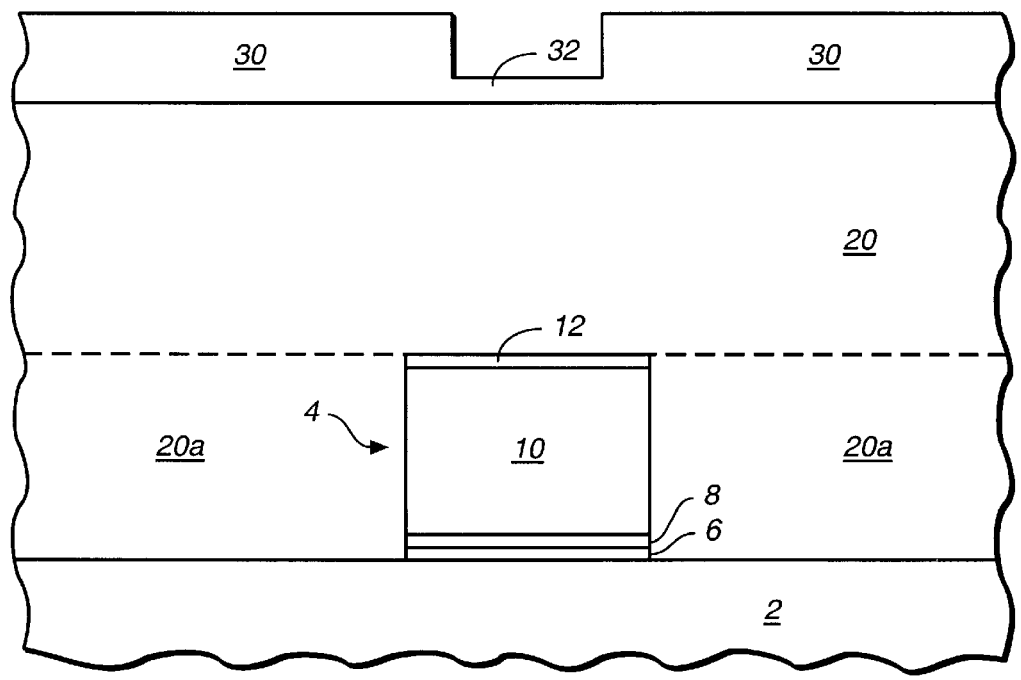
FIG._2

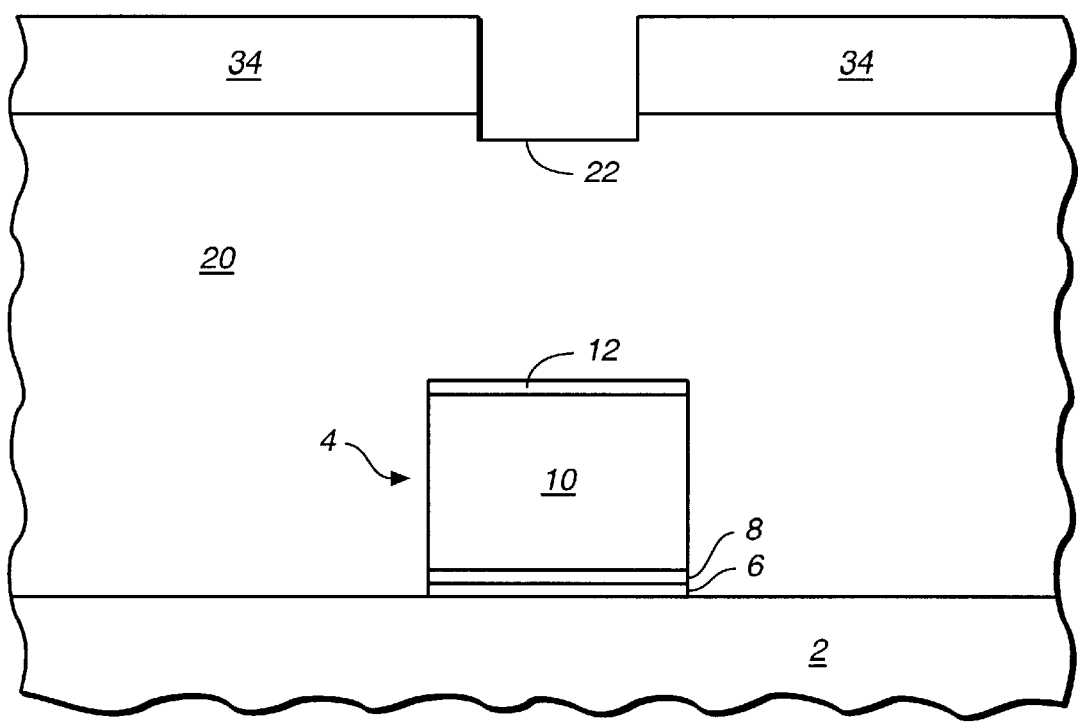
FIG._3

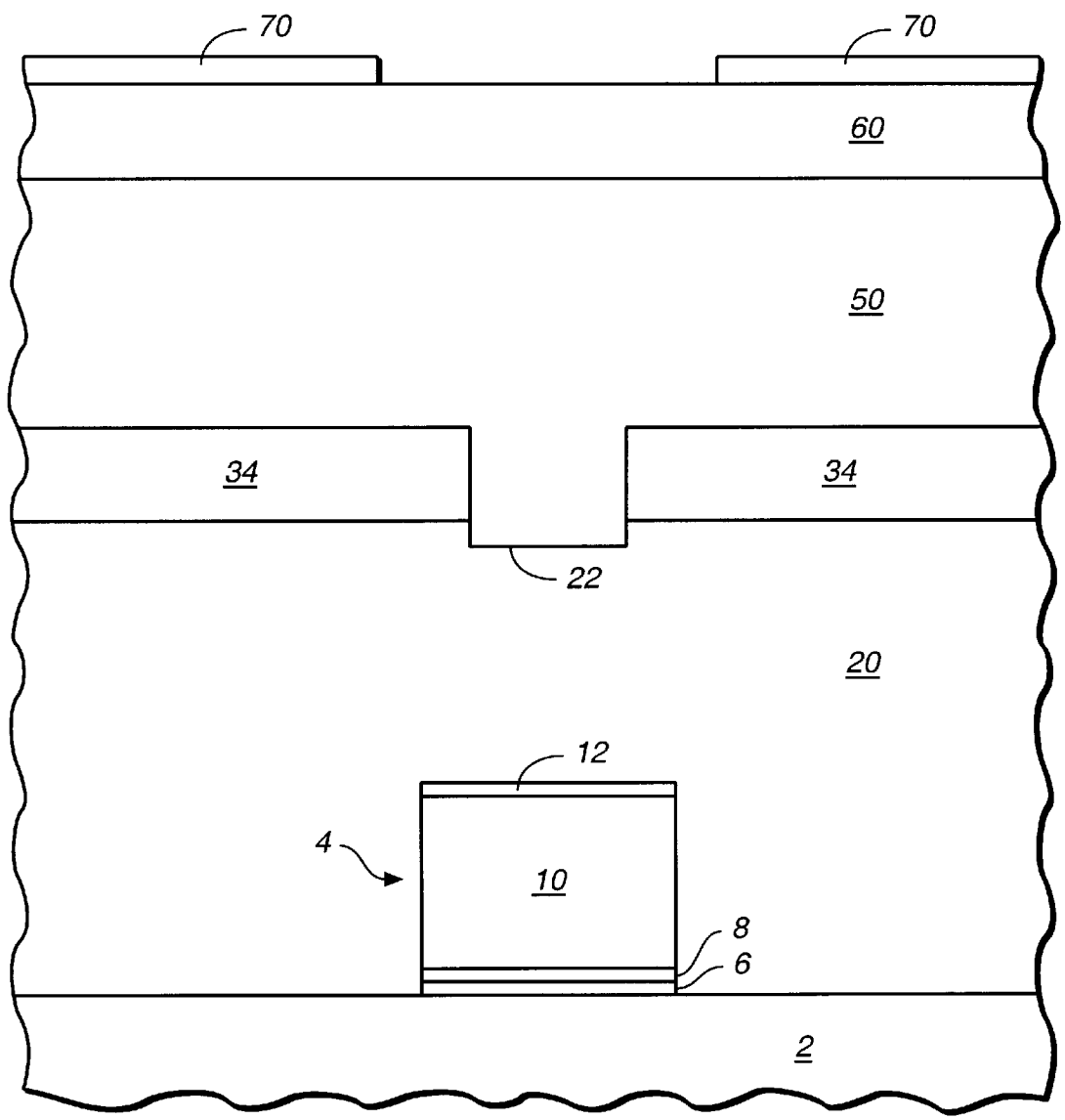
FIG._4

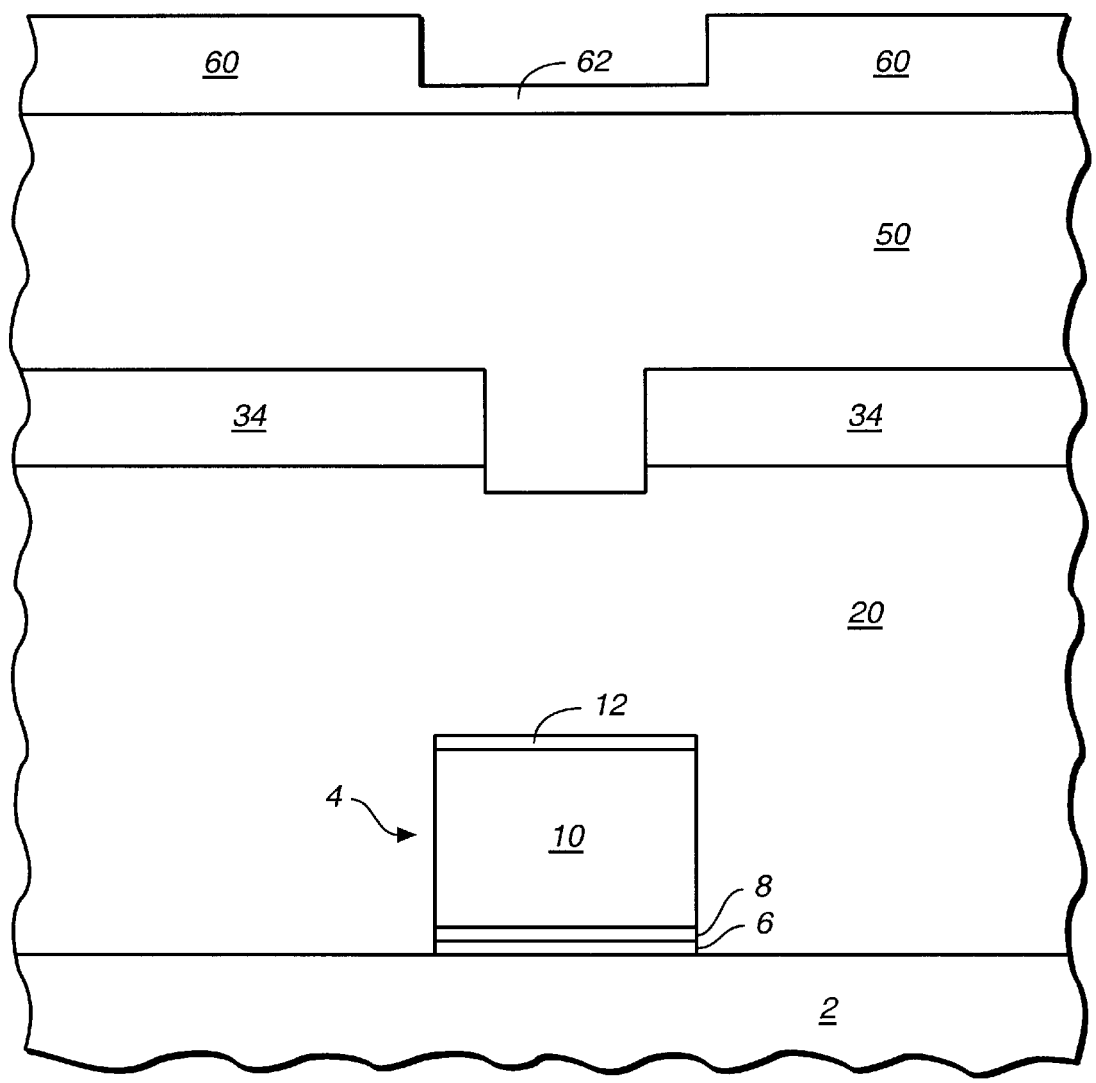
FIG._5

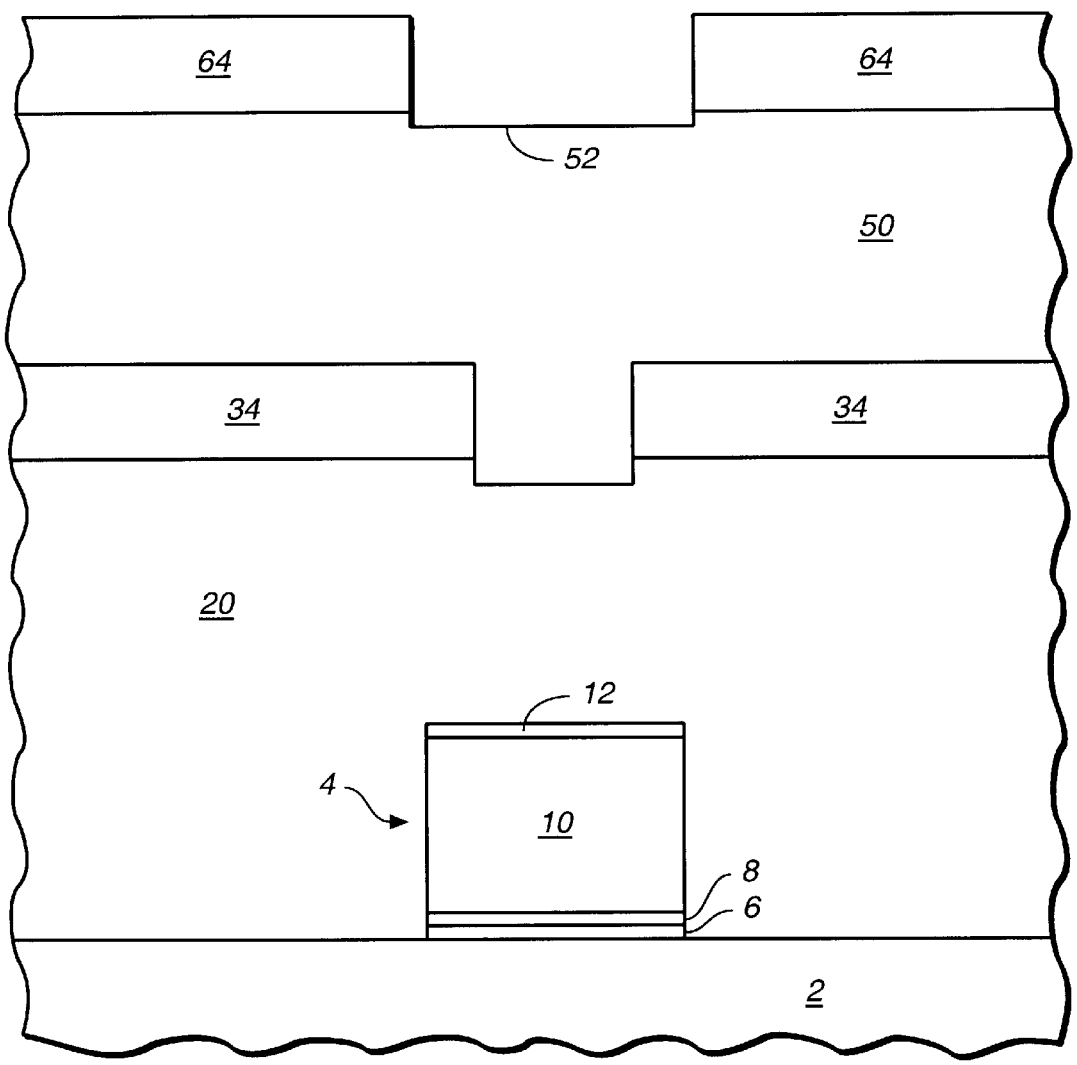
FIG._6

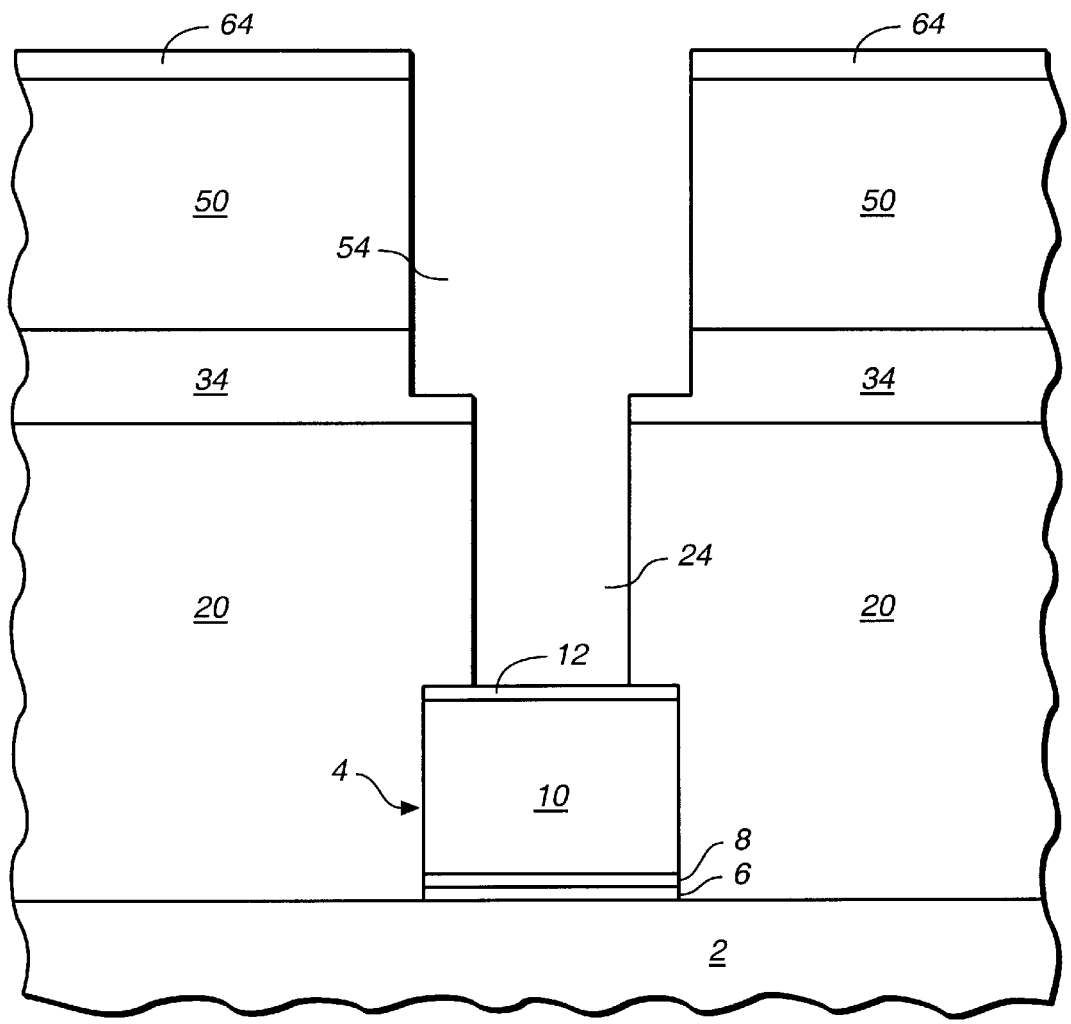
FIG._7

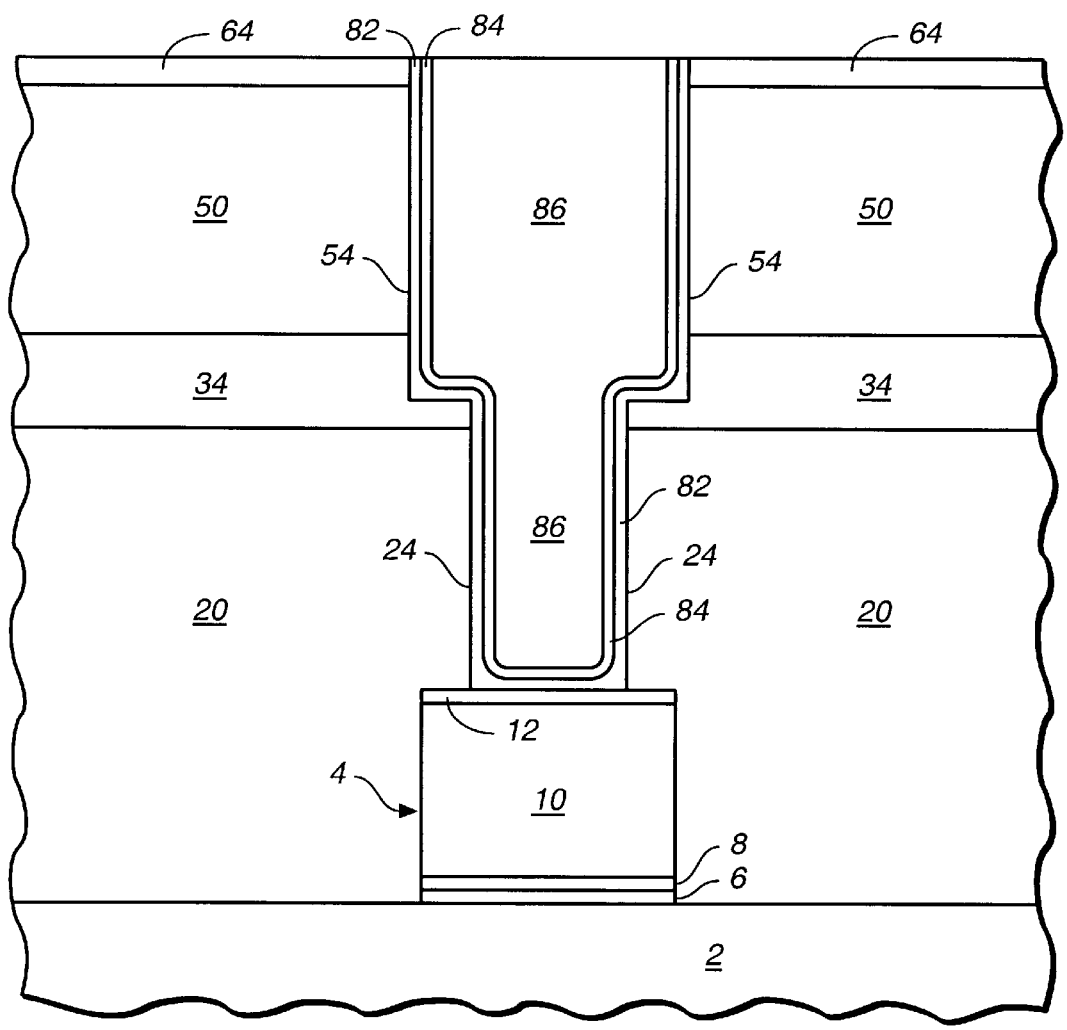
FIG._8

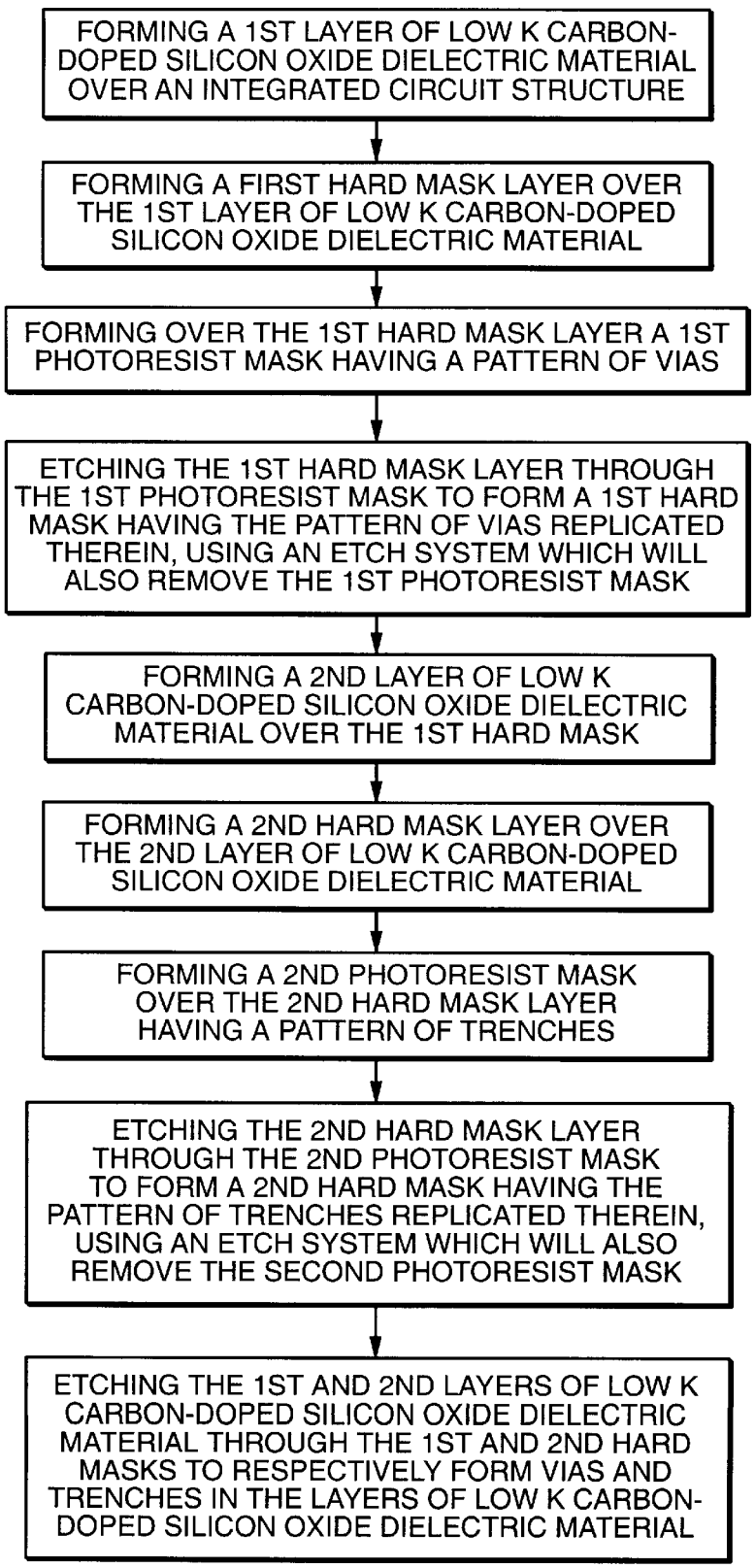
FIG._9

PROCESS FOR FORMING TRENCHES AND VIAS IN LAYERS OF LOW DIELECTRIC CONSTANT CARBON-DOPED SILICON OXIDE DIELECTRIC MATERIAL OF AN INTEGRATED CIRCUIT STRUCTURE

CROSS REFERENCE TO RELATED APPLICATION

The subject matter of this application relates to the subject matter of copending U.S. patent application Ser. No. 09/607,512, entitled "PROCESS FOR FORMING TRENCHES AND VIAS IN LAYERS OF LOW DIELECTRIC CONSTANT CARBON-DOPED SILICON OXIDE DIELECTRIC MATERIAL OF AN INTEGRATED CIRCUIT STRUCTURE WHILE INHIBITING DAMAGE TO THE LAYERS OF LOW DIELECTRIC CONSTANT CARBON-DOPED SILICON OXIDE DIELECTRIC MATERIAL", assigned to the assignee of this application, and filed on Jun. 28, 2000.

BACKGROUND OF THE INVENTION

1. Field of the Invention

This invention relates to the formation of a dual damascene structure comprising trenches and vias in low dielectric constant (low k) dielectric material. More particularly, this invention relates to a process for forming a dual damascene structure comprising patterns of trenches and vias respectively formed in layers of low k dielectric material of an integrated circuit structure while mitigating damage to the low k dielectric material during removal of the photoresist masks used in the formation of the respective trenches and vias of the dual damascene structure.

2. Description of the Related Art

The shrinking of integrated circuits has resulted in levels of interconnects, including metal interconnects, being placed closer together, as well as reduction of the horizontal spacing between metal lines on any particular level of such interconnects. As a result, capacitance has increased between such conductive portions, resulting in loss of speed and increased cross-talk. One proposed approach to solving this problem of high capacitance is to replace the conventional silicon oxide ($SiO_2$) dielectric material, having a dielectric constant (k) of about 4.0, with another insulation material having a lower dielectric constant to thereby lower the capacitance.

In an article by L. Peters, entitled "Pursuing the Perfect Low-K Dielectric", published in Semiconductor International, Volume 21, No. 10, September 1998, at pages 64–74, a number of such alternate dielectric materials are disclosed and discussed. Included in these dielectric materials is a description of a low k dielectric material having a dielectric constant of about 3.0 formed using a Flowfill chemical vapor deposition (CVD) process developed by Trikon Technologies of Newport, Gwent, U.K. The process is said to react methyl silane ($CH_3—SiH_3$) with hydrogen peroxide ($H_2O_2$) to form monosilicic acid which condenses on a cool wafer and is converted into an amorphous methyl-doped silicon oxide which is then annealed to remove moisture. Such carbon-containing silicon oxide insulating materials formed in this manner, sometimes referred to as low k carbon-doped silicon oxide dielectric material, exhibit good gap-filling capabilities and at the same time are characterized by a dielectric constant less than 3.0 and remain stable during subsequent annealing at temperatures of up to 500° C.

However, it has been found that such carbon-doped silicon oxide dielectric material is more sensitive than conventional undoped silicon oxide to process procedures or systems subsequently carried out during formation of the integrated circuit structure. For example, the low k carbon-doped silicon oxide dielectric material has been found to be easily damaged by the conventional $O_2$-based ashing system used to remove photoresist masks after vias or contact openings are formed through the low k dielectric material. While upper and lower capping layers of conventional undoped $SiO_2$ can be applied below and above the layer of carbon-doped silicon oxide dielectric material, to respectively protect the lower and upper surfaces of the low k material, this does not protect the freshly exposed sidewall surfaces of newly formed vias or contact openings etched through the layer of low k carbon-doped silicon oxide dielectric material. The carbon-silicon bonds in the low k carbon-doped silicon oxide dielectric material are more easily attacked and broken by the oxygen atoms utilized in the ashing treatment than are the silicon-oxygen bonds in conventional undoped silicon oxide dielectric material, resulting in via "poisoning" wherein filler materials used to fill such damaged vias does not properly adhere to the via surfaces.

Many of the same reasons for turning to the use of dielectric materials having lower dielectric constants, e.g., for increased performance, including speed, have also led to the increased use of copper instead of aluminum or tungsten in the formation of metal interconnects, as well as via filler material, for integrated circuit structures. However, while a layer of aluminum interconnects may be easily formed by depositing a layer of aluminum metal over a dielectric layer of an integrated circuit structure, followed by patterning of the aluminum layer through a mask to form aluminum interconnects, and subsequent deposition of dielectric material in the spaces between the metal interconnects, layers of copper interconnects are not so easily formed. This is due to difficulty in patterning (etching) of a previously deposited copper layer. This has lead to the development of a process commonly known as the damascene or dual damascene process.

In the damascene process the dielectric material which will separate the copper interconnects is first deposited as a dielectric layer in which trenches are then formed (usually through the entire thickness of the dielectric layer), corresponding to the desired pattern of copper interconnects. A layer of copper is then deposited over the patterned dielectric layer and into the trenches, filling them completely. All surface copper is then removed, e.g., by chemical mechanical polishing (CMP), leaving the desired pattern of copper interconnects in the trenches. When this same process is combined with the forming of openings (vias) in a lower dielectric layer to form copper-filled vias therein, followed by filling of both vias and trenches with copper, usually in a single deposition step, the process is referred to as a dual damascene process.

While the use of copper-filled vias and copper interconnects, formed in layers of low k carbon-doped silicon oxide dielectric material by the dual damascene process, would be useful, the sensitivity of the low k carbon-doped silicon oxide dielectric material to the ashing process used to remove the photoresist mask is exacerbated when copper vias and interconnects are formed in such low k carbon-doped silicon oxide dielectric material. This is because the conventional dual damascene process involves the use (and removal) of two photoresist masks, one to define the vias formed in a lower layer of low k carbon-doped silicon oxide dielectric material, and another photoresist mask to define the trenches in an upper layer of low k carbon-doped silicon oxide dielectric material, thus increasing the possibility of damage to the low k carbon-doped silicon oxide dielectric material during removal of the two photoresist masks.

It would, therefore, be desirable to provide a process wherein copper interconnects and copper-filled vias could be formed in low k carbon-doped silicon oxide dielectric material without causing damage to the low k carbon-doped silicon oxide dielectric material during the removal of the photoresist masks used to define the patterns of trench openings and vias formed in the low k carbon-doped silicon oxide dielectric material.

SUMMARY OF THE INVENTION

The invention comprises a dual damascene structure of vias and trenches formed using layers of low k carbon-doped silicon oxide dielectric material, and a process for making same, wherein a pattern of via openings and a pattern of trench openings can be respectively formed in layers of low k carbon-doped silicon oxide dielectric material without damage to the low k carbon-doped silicon oxide dielectric material during removal of photoresist masks used respectively in the formation of the pattern of via openings and the pattern of trench openings in the layers of low k carbon-doped silicon oxide dielectric material.

The improved process of the invention comprises: forming a first layer of low k carbon-doped silicon oxide dielectric material on an integrated circuit structure; forming a first hard mask layer over the first layer of low k carbon-doped silicon oxide dielectric material; forming over the first hard mask layer a first photoresist mask having a pattern of via openings therein; etching the first hard mask layer through the first photoresist mask to form a first hard mask having the pattern of vias openings replicated therein, using an etch system which will also remove the first photoresist mask; forming a second layer of low k carbon-doped silicon oxide dielectric material over the first hard mask; forming over the second layer of low k carbon-doped silicon oxide dielectric material a second hard mask layer; forming over the second hard mask layer a second photoresist mask having a pattern of trench openings therein; etching the second hard mask layer through the second photoresist resist mask to form a second hard mask having the pattern of trench openings replicated therein, using at etch system which will also remove the second photoresist mask; and then etching the first and second layers of low k carbon-doped silicon oxide dielectric materials through the first and second hard masks to form vias in the first layer of low k carbon-doped silicon oxide dielectric material and trenches in the second layer of low k carbon-doped silicon oxide dielectric material; whereby a pattern of via openings and a pattern of trench openings can be respectively formed in layers of low k carbon-doped silicon oxide dielectric material without damage to the low k carbon-doped silicon oxide dielectric material during removal of the photoresist masks used respectively in the formation of the pattern of via openings and the pattern of trench openings.

BRIEF DESCRIPTION OF THE DRAWINGS

FIG. 1 is a fragmentary vertical cross-sectional view of an integrated circuit structure including a raised line structure with a first layer of low k carbon-doped silicon oxide dielectric material formed over the line, a first hard mask layer formed over the first layer of low k dielectric material, and a first photoresist mask formed over the first hard mask layer.

FIG. 2 is a fragmentary vertical cross-sectional view of the structure of FIG. 1 showing the first hard mask layer partially patterned and the first photoresist mask etched away.

FIG. 3 is a fragmentary vertical cross-sectional view of the structure of FIG. 2 showing the first hard mask layer patterned to form a first hard mask replicating the via openings in the first photoresist mask.

FIG. 4 is a fragmentary vertical cross-sectional view of the structure of FIG. 3 showing a second layer of low k dielectric material formed over the first hard mask, a second hard mask layer formed over the second layer of low k dielectric material, and a second photoresist mask formed over the second hard mask layer.

FIG. 5 is a fragmentary vertical cross-sectional view of the structure of FIG. 4 showing the second hard mask layer partially patterned and the second photoresist mask etched away.

FIG. 6 is a fragmentary vertical cross-sectional view of the structure of FIG. 5 showing the second hard mask layer patterned to form a second hard mask replicating the trench openings in the second photoresist mask.

FIG. 7 is a fragmentary vertical cross-sectional view of the structure of FIG. 6 showing the first and second layers of low k dielectric material respectively etched through the first and second hard masks to form a via in the first layer of low k dielectric material and a trench in the second layer of low k dielectric material.

FIG. 8 is a fragmentary vertical cross-sectional view of the structure of FIG. 7 showing the via and trench lined with titanium and titanium nitride layers and then filled with copper.

FIG. 9 is a flow sheet illustrating the process of the invention.

DETAILED DESCRIPTION OF THE INVENTION

The invention comprises a dual damascene type of structure of vias and trenches formed using layers of low k dielectric material, and a process for making same without damage to the low k dielectric material during removal of photoresist masks used respectively in the formation of the pattern of via openings and the pattern of trench openings in the layers of low k dielectric material.

Damage to the low k dielectric material is avoided by forming a first layer of low k dielectric material on an integrated circuit structure; forming a first hard mask layer over the first layer of low k dielectric material; forming over the first hard mask layer a first photoresist mask having a pattern of via openings therein; and then etching the first hard mask layer through the first photoresist mask to form a first hard mask having the pattern of vias openings replicated therein, using an etch system which will also remove the first photoresist mask. The first photoresist mask (the via mask) is, therefore, removed during the formation of the first hard mask, instead of in a separate oxidizing step which would damage the low k dielectric material.

Similarly, damage to the low k dielectric material during removal of the second photoresist mask (the trench mask) is avoided by depositing a second layer of low k dielectric material over the first hard mask; forming over the second layer of low k dielectric material a second hard mask layer; forming over the second hard mask layer a second photoresist mask having a pattern of trench openings therein; and then forming the second hard mask by etching the second hard mask layer through the second photoresist resist mask to form a second hard mask having the pattern of trench openings replicated therein, using at etch system which will also remove the second photoresist mask. Thus, the second photoresist mask (the trench mask) is also removed during the formation of the second hard mask, instead of in a separate oxidizing step which would damage the low k dielectric material.

After formation of the two hard masks and removal of the two photoresist masks, the remainder of the portions of the two layers of low k dielectric material exposed by the hard masks is etched to form the dual damascene structure of trenches and vias in the low k dielectric material without exposure of the low k dielectric material to the conventional oxidizing agents used to remove photoresist material, thereby avoiding the "poisoning of the vias.

The process and resulting product of the invention is further illustrated in the accompanying drawings. Turning to FIG. 1, an upper fragment of an integrated circuit structure is shown at 2 having an electrically conductive raised composite line or interconnect generally indicated at 4 thereon comprising a first electrically conductive layer 6 of a material such as titanium metal which will facilitate bonding of composite line 4 to the underlying integrated circuit structure 2, an electrically conductive barrier layer 8 such as titanium nitride to separate the underlying metal or silicon in integrated circuit structure 2 from main electrically conductive metal layer 10 in the composite line structure. Main metal layer 10 may comprise any electrically conductive metal such as aluminum, tungsten, or copper, by way of illustration and not of limitation.

Over main metal layer 10 may be formed a top layer 12 comprising an electrically conductive layer of a material such as titanium nitride which may function both as a barrier layer and as an antireflective coating (ARC) layer to facilitate photolithographic processing above composite line structure 4. It should be noted that composite line 4 shown in the drawings and its particular material makeup just described form no part of the invention and are rather shown and described for illustrative purposes only.

Still referring to FIG. 1, a first layer 20 of low k dielectric material, such as low k carbon-doped silicon oxide dielectric material, is shown formed over integrated circuit structure 2 and composite line 4. While the invention is not limited to use with low k carbon-doped silicon oxide dielectric material, the use of such low k dielectric material comprises the best mode known for the practice of the invention. Thus low k dielectric layer 20 may hereinafter be described as comprising low k carbon-containing silicon oxide dielectric material by way of illustration, and not of limitation.

The low k carbon-containing silicon oxide dielectric material useful in the practice of the invention may comprise, for example, the methyl silicon oxide dielectric material such as described in the above-cited Peters article or the organo-silicon oxide dielectric material described and claimed in copending U.S. patent application Ser. No. 09/274,457, filed Mar. 22, 1999, entitled "LOW DIELECTRIC CONSTANT MULTIPLE CARBON-CONTAINING SILICON OXIDE DIELECTRIC MATERIAL FOR USE IN INTEGRATED CIRCUIT STRUCTURES, AND METHOD OF MAKING SAME", which is assigned to the assignee of this invention, and the subject matter of which is hereby incorporated herein by reference.

When raised composite line 4 represents a layer of aluminum interconnects, layer 20 of low k dielectric material may be formed around and above raised composite line 4 as shown. Alternatively, when main metal layer 10 in raised composite layer structure 4 comprises copper, the low k layer may be formed as two layers 20 and 20a (as shown by the dotted lines in FIGS. 1 and 2), with lower level layer 20a having been formed prior to formation of raised composite line 4 followed by formation of a trench in the lower level layer using, for example, the process of the invention. In either case, the thickness of low k layer 20 above the top surface of raised composite line 4 will range from about 100 nanometers (nm) to about 1000 nm, and typically will be about 500 nm.

Still referring to FIG. 1, over first low k dielectric layer 20 is formed a first hard mask layer 30 comprising a layer of dielectric material which is preferably low k dielectric material, but in any case comprises a dielectric material capable of being etched by an etch system selective to the material constituting first low k dielectric layer 20. For example, when first low k dielectric layer 20 comprises carbon-doped silicon oxide dielectric material, first hard mask layer 30 may comprise a silicon nitride or silicon carbide material. The purpose of first hard mask layer 30 is to form a via hard mask over first low k dielectric layer 20 which replicates a pattern of vias in a photoresist mask which will be formed over first hard mask layer 30, as will be described below. Therefore, since vias will be etched through first low k dielectric layer 20 using the hard mask formed from first hard mask layer 30, the thickness of first hard mask layer 30 will be dependant upon the dielectric material used to form first hard mask layer 30, the thickness of first low k dielectric layer 20, and the selectivity of the etchant system used to etch first low k dielectric layer 20 through the hard mask. However, the thickness of first hard mask layer 30 will also be dependent upon other factors as will be described below, including the thickness of first photoresist mask 40 formed over first hard mask layer 30 during the formation of the first hard mask.

Over first hard mask layer 30 is formed a first photoresist mask 40 having a pattern of vias formed therein. First photoresist mask 40 is used to form a first hard mask 34 in hard mask layer 30, using an anisotropic etch system having a predetermined etch selectivity with respect to overlying photoresist mask 40. Preferably the dielectric material constituting hard mask layer 30 is etched at a slower rate than first photoresist mask 40 to thereby permit removal or consumption of the first photoresist mask 40 during formation of first hard mask 34 from first hard mask layer 30. As shown in FIG. 2, when the etching of first hard mask layer 30 commences through first photoresist mask 40 to form first hard mask 34, photoresist layer 40 is also consumed or etched away, preferably before the entire thickness of hard mask layer 30 is etched through to underlying first layer 30 of low k dielectric material, although this is not believed to be necessary provided that an oxygen-based etchant system is not utilized.

Etchants systems useful in the process of the invention should exhibit a selectivity of at least 3:1 between low k dielectric material and the material constituting the hard mask. That is the low k dielectric material should etch at a rate at least 3 times faster than the hard mask. The etchant should also etch the photoresist mask at a faster rate than the hard mask to facilitate removal of all of the photoresist mask material during the process. Oxygen-containing etchants should be avoided to avoid damaging the low k dielectric material. Plasma etches such as a RIE system can be used. Typical useful etch chemistries include one or more fluorocarbons such as $CF_4$, $CHF_3$, $CH_2F_2$, $CH_3F$, and combinations thereof.

However, since the etchant system selected for the process etches the first hard mask material at a slower rate than the etch rate of the photoresist, when all of the photoresist mask has been consumed, not all of the thickness of the thicker hard mask layer 30 is necessarily already etched through, as seen at 32 in FIG. 2, resulting in a self-masking effect for the remainder of the etch through hard mask layer 30 to form hard mask 34. That is, after consumption of photoresist mask 40 over the top surface of hard mask layer 30, this now-exposed top surface of hard mask layer 30 is subject to a blanket etch which will remove some of the top surface of hard mask layer 30 (thereby reducing the overall thickness of mask layer 30) as well as continuing to remove material from the bottom of the via etch mask openings being formed in hard mask layer 30, using the already formed partial via hard mask opening in hard mask layer 30 as a mask for the remainder of the etch. The result is shown in FIG. 3, wherein first hard mask 34 is shown completely formed with some of underlying first layer 20 of low k dielectric material also partially etched away, as shown at 22.

With completion of the formation of first hard mask 34, which will function as the via mask for first layer 20 of low k dielectric material, a second layer 50 of low k dielectric material is now deposited over first hard mask 34, as shown in FIG. 4. Second low k dielectric layer 50 will comprise an etchable low k dielectric material which is different from the material used to form first hard mask 34 so that second low k dielectric layer 50 may be etched independently of hard mask 34. Second layer 50 of low k dielectric material preferably comprises the same low k dielectric material used to form first layer 20 of low k dielectric material to facilitate etching of both low k dielectric layers with the same etch system, although it is not mandatory that the same low k dielectric material be used for both layers 20 and 50. Second low k dielectric layer 50 may range in thickness from about 100 nm to about 1000 nm, and typically will be about 500 nm.

As shown in FIG. 4, after formation of second layer 50 of low k dielectric material, a second hard mask layer 60 is formed over second low k layer 50. Second hard mask layer 60 may be formed of the same material as first hard mask layer 30, i.e., silicon nitride or silicon carbide. If it is desired to be able to independently etch the respective hard masks to be formed from hard mask layers 30 and 60, one of the hard masks could be formed from silicon carbide while the other hard mask is formed from silicon nitride.

After formation of second hard mask layer 60, a second photoresist mask 70 is formed over second hard mask layer 60. Second photoresist mask 70 is patterned to provide trench openings therein which, in accordance with the invention, will be replicated in the second hard mask to be formed from second hard mask layer 60.

After formation of second layer 50 of low k dielectric material, second hard mask layer 60, and second photoresist mask 70, second hard mask layer 60 is patterned by an anisotropic etch through second photoresist mask 70 similarly to the earlier formation of first hard mask 34 to thereby form a second hard mask 64 having replicated therein the pattern of trench openings in second photoresist mask 70, as shown progressively in FIGS. 5 and 6. FIG. 5 shows the etching of second hard mask layer 60 at an incomplete stage wherein the etch has progressed sufficiently for second photoresist mask 70 to be completely etched away, with most of the thickness of second hard mask layer 60 etched away in the regions of the trench openings, as shown at 62.

FIG. 6 shows completion of the etching of second hard mask layer 60 to form second hard mask 64, with a slight overetch into second low k layer 50, as shown at 52. Once again, as previously discussed with regard to the formation of first hard mask 34, the partial etching of second hard mask layer 60 to partially form the trench opening therein provides a self-masking for the completion of the patterning process to form second hard mask 64 after second photoresist mask 70 has been completely consumed by the etch system being used. Furthermore, as further shown in FIG. 5, in the preferred embodiment all of second photoresist mask 70 is removed prior to exposure of any surfaces of second layer 50 of low k dielectric material, although (as discussed earlier with respect to the formation of first hard mask 34 over first layer 20 of low k dielectric material) this is not mandatory.

After completion of the formation of second hard mask 64 over second layer 50 of low k dielectric material, formation of trenches in second low k dielectric layer 50 and vias in first low k dielectric layer 20 can be carried out using first (via) hard mask 34 and second (trench) hard mask 64. The particular etch system chosen for this etch will be selective to the material used for the formation of the hard masks. That is the low k dielectric material comprising layers 20 and 50 will be etched in preference to the material comprising hard masks 34 and 64. The results are shown in FIG. 7 which shows a via 24 formed in first layer 20 of low k dielectric material through first hard mask 34 and a trench 54 formed in second layer 50 of low k dielectric material through second hard mask 64.

It will be noted that in FIG. 7 the etching of the layers of low k dielectric material is shown as stopping at top layer 12 of composite line 4. Depending upon the makeup of the material comprising top layer 12 of composite line 4, it may be desirable to then etch away the exposed portion of top layer 12 before depositing the liner materials for via 24 and trench 54 prior to filling via 24 and trench 54 with the main electrically conductive material such as copper, as will be described below.

Turning now to FIG. 8, the final structure is shown comprising a trench structure 54 representing a pattern of metal interconnects or lines interconnecting vias such as illustrated by via 24. When a metal such as copper is used as the main electrically conductive metal in the trenches and vias, a first layer 82 of an electrically conductive metal such as titanium can be deposited over the via and trench surfaces to facilitate adherence of the filler materials to the surfaces of the vias and trenches. A barrier layer 84 of an electrically conductive material such as titanium nitride may then be formed over layer 82 to provide a barrier between the main copper filler material and other underlying layers, as well as the sidewalls of the low k dielectric material. The main electrically conductive metal layer 86 comprising a metal such as copper then is deposited over the entire structure to fill the vias and trenches. While it will be appreciated that metal other than copper can be used as the main filler material, the dual damascene type structure with filled trenches and vias finds particular utility in connection with the use of a copper filler material due to the difficulty of patterning a previously deposited layer of copper. As shown in FIG. 8, the structure may then be planarized using, for example, a chemical mechanical polishing (CMP) process.

In the above described novel dual damascene type of structure of the invention, it will be noted that the conventional ashing process is not used to remove the photoresist masks, thereby resulting in a dual damascene type of structure formed with highly desired low k dielectric material without, however, the usual damaged surfaces of the low k dielectric material where the vias and trenches have been formed which can result in the previously discussed via "poisoning". The process of this invention relies instead on: 1) the removal of the photoresist masks during the formation of the hard masks; and 2) the subsequent use of the hard masks as substitutes for the photoresist masks during the etching of the layers of low k dielectric materials to form the respective patterns of vias and trenches.

It is, therefore, important to the practice of this invention to select hard mask materials and selective etch systems which: 1) will permit etching of the trench or via pattern in the respective layer of low k dielectric material through the respective hard mask; and 2) will permit removal of the photoresist mask during the formation of the corresponding hard mask.

With respect to the formation of the trenches and vias in the layers of low k dielectric material through the respective hard masks, the previously recited thickness ranges of the respective layers of low k dielectric materials are standard thicknesses not unique to the process of this invention, but rather governed by other factors such as adequate vertical insulation between metal interconnect layers, as well as vertical capacitance, vertical resistance path of the vias, etc. With this in mind, it will be appreciated that the selectivity of the etch system, type and thickness of the hard mask, and thickness of the initial photoresist mask are variables which can be adjusted to optimize the process. Furthermore, since the dielectric constant (k value) of the hard mask material will usually be higher that the k value of the low k dielectric material, it is desirable that the thickness of the hard mask be as thin as possible without compromising the quality and integrity of the process. This is particularly true of the first (via) hard mask, since the second (trench) hard mask could be thinned or removed after formation of the trenches in the second layer of low k dielectric material.

Thus, for example, when the first layer of low k dielectric material comprises a carbon-doped silicon oxide dielectric material having a typical thickness of about 500 nm and the first (via) hard mask over that low k layer comprises silicon carbide, an RIE plasma etch could be used with $CF_4$ and $CH_2F_2$ chemistry to provide a selectivity of 3:1. That is, the etch system would etch the low k material at a rate 3 times the rate at which the silicon carbide hard mask would be etched. Therefore, for a 500 nm thick low k dielectric layer, this would require a minimum thickness of the first silicon carbide hard mask for the via formation to be at least 167 nm (and in practice probably at least 200 nm to about 300 nm) to avoid consumption of the silicon carbide hard mask prior to completion of the etch through the low k material to form the vias therein.

The photoresist masks used to initially form the hard masks usually range in thickness from about 600 nm to about 800 nm (~6 to ~8 kilo Angstroms) and the etch rate or selectivity is about 1:2 for the previously described etch system (an RIE plasma etch with $CF_4$ and $CH_2F_2$ chemistry), using silicon carbide as the hard mask dielectric material. That is the photoresist etches at a rate approximately twice that of the silicon carbide hard mask layer, using that particular etch system.

Thus, when the first photoresist mask is 600 nm in thickness and the initial thickness of the first silicon carbide hard mask layer is about 350 nm, a partial etch through the first photoresist mask to form the via hard mask would remove 300 nm of silicon carbide in the exposed openings in the photoresist mask during the time the first photoresist mask would be completely consumed (leaving 50 nm of silicon carbide still in the via openings being formed in the silicon carbide hard mask layer). A further blanket etch of the now exposed silicon carbide hard mask layer to thin the hard mask layer from 350 nm to 300 nm would, at the same time, remove the remaining 50 nm of silicon carbide in the via openings to complete the via openings in the first hard mask, resulting in a 300 nm thick first (via) hard mask.

If a thinner first hard mask of, for example, about 200 nm is desired, using the same etching system and hard mask material (silicon carbide), an initial photoresist mask thickness of 400 nm can be formed over a 250 nm thick hard mask layer of silicon carbide. An initial etch of 200 nm of the exposed silicon carbide through the first photoresist mask would result in consumption of all of the photoresist mask. A further blanket etch of the silicon carbide layer would thin the hard mask to 200 nm while, at the same time, completing the via etch through the remaining 50 nm of the hard mask material in the via openings, resulting in a 200 nm thick first (via) hard mask. Similarly, a 250 nm thick silicon carbide via mask could be formed with the same etching system and the same materials using a 500 nm photoresist mask over a 300 nm silicon carbide hard mask layer. Any of these thickness of the silicon carbide hard mask would probably be satisfactory for the formation of the vias in the first layer of low k dielectric material.

However, for the second hard mask (the trench hard mask), a further mask thickness should be provided to compensate for the additional etching of the trench hard mask. The second (trench) hard mask must be able to withstand not only the trench etch through the upper or second layer of low k dielectric material, which is also about 500 nm in thickness, but it must also withstand the continuation of that etch through the bottom or first layer of low k dielectric material to etch the vias through the via hard mask. This will be appreciated by comparing the structure shown in FIG. 6 (before formation of the vias and trenches) and FIG. 7 (after the etch to form the vias and trenches).

Therefore, using the previously described etch system and hard mask materials, the second hard mask would probably have to be at least twice as thick (2×167 nm) to avoid premature consumption of the hard mask prior to complete formation of both the trenches and the vias in the respective low k layers. Typically, for the same etch system and hard mask material previously described (an RIE plasma etch with $CF_4$ and $CH_2F_2$ chemistry and silicon carbide as the trench hard mask), the thickness of the second (trench) hard mask would, therefore, range from about 400 nm to about 500 nm.

Thus, when the thicknesses of each of the two layers of low k dielectric material is 500 nm and the selectivity of the via and trench etches through the hard mask is 3:1, the second hard mask should be at least about 400 nm to about 500 nm in thickness to ensure that the second hard mask is not consumed prior to completion of the trench and via etches through the two layers of low k dielectric material.

Alternatively, the second layer of low k dielectric material could be initially formed with an oversized thickness (for example, ~600 nm ~700 nm instead of ~500 nm), whereby an excess amount of the second hard mask left after completion of the via etch could then be removed by blanket etching or by planarization such as CMP. This removal of a deliberate excess thickness of the second hard mask after the trench/via etch may be preferred when the second hard mask material is not a low k dielectric material and excess thickness of the hard mask material after the trench and via formation is therefore not desirable.

As in the previous discussion of the formation of the first (via) hard mask, in addition to the second hard mask thickness needed for the etching of both layers of low k dielectric material, an additional initial thickness of the second hard mask layer should be provided to compensate for the amount of hard mask thickness which will be etched away during initial formation of the hard mask from the hard mask layer using the second photoresist mask which is to be consumed during this formation of the second hard mask. This is because, as previously described, in accordance with the invention, it is intended that the photoresist mask over the second hard mask layer be consumed during the formation of the second hard mask, thereby exposing the upper surface of the hard mask layer.

Thus, for example, if the second photoresist mask initially used to form the second hard mask is about 800 nm in thickness, the second hard mask layer is also silicon carbide, the selectivity ratio of the etch used to form the second hard mask through the second photoresist mask is again 1:2 (using the same etch chemistry), and the initial thickness of the second hard mask layer is 450 nm, the initial etch to remove the 800 nm thick second photoresist mask would also remove 400 nm of the hard mask in the trench openings being formed therein. An additional blanket etch to remove an additional 50 nm of the now exposed surface of the second silicon carbide hard mask would also complete the formation of the trench openings in the second hard mask, resulting in a 400 nm thick second (trench) hard mask. Formation of a 500 nm second (trench) hard mask could then be made, for example, by substituting a 1000 nm second photoresist mask and a 550 nm second hard mask layer. Removal (etching away) of the 1000 nm second photoresist mask would then result in removal of 500 nm of the silicon carbide in the trench openings. Formation of the 500 nm thick second (trench) hard mask would then be completed by a blanket etch to remove another 50 nm of the silicon carbide mask layer.

It will be readily seen that the thicknesses of the respective hard masks will be dependent upon the materials chosen for the hard mask layer, the selectivity of the etch system or systems used to form the respective hard masks, and the initial thickness of the photoresist mask used to form the hard mask. If, for example, the selectivity of the etch used to form the trenches and vias in the layers of low k dielectric material through the hard mask was 6:1 rather than 3:1, the via hard mask thickness required to etch a 500 nm layer of low k dielectric material would probably only be about 100 nm to 150 nm instead of the previously mentioned 200 nm to 300 nm, and the trench hard mask could also be thinner.

Therefore, to avoid excessive thickness of the hard mask (which may have an adverse effect on the capacitance of the structure) it is very important that the etch selectivity used during the etching of the layers of low k dielectric material be as high as possible. This is particularly important for the via etch using the first hard mask since an excessive thickness of the second hard mask remaining after the trench etch may be removed, for example, by a planarizing step such as a CMP planarization, unlike the first hard mask which is encapsulated between the first and second layers of low k dielectric material.

Thus, the invention provides a dual damascene type of structure for an integrated circuit structure, using layers of low k dielectric material in which vias and trenches are respectively formed without damage to such low k material during removal of the photoresist masks used in the formation of the trench and via openings. Such damage to the layers of low k dielectric material is avoided by the use of hard masks in which the initial via or trench pattern in the respective photoresist mask is replicated. The removal of the photoresist mask during the formation of the respective hard mask and the subsequent use of the hard masks as substitutes for the photoresist masks during the etching of the layers of low k dielectric materials to form the respective patterns of vias and trenches results in avoidance of the prior art damage to the low k dielectric material and resulting via "poisoning".

Having thus described the invention what is claimed is:

1. A process for forming an integrated circuit structure comprising dual layers of low k dielectric material, with via openings and trench openings respectively formed in said dual layers while mitigating damage to said low k dielectric material, said process comprising:
   a) forming a first layer of low k dielectric material on an integrated circuit structure;
   b) forming a first hard mask layer over said first layer of low k dielectric material;
   c) forming over said first hard mask layer a first photoresist mask having a pattern of via openings therein;
   d) etching said first hard mask layer through said first photoresist mask to form a first hard mask having said pattern of vias openings in said first photoresist mask replicated therein, using an etch system which will also remove said first photoresist mask;
   e) forming a second layer of low k dielectric material over said first hard mask;
   f) forming over said second layer of low k dielectric material a second hard mask layer;
   g) forming over said second hard mask layer a second photoresist mask having a pattern of trench openings therein;
   h) etching said second hard mask layer through said second photoresist resist mask to form a second hard mask having the pattern of trench openings in said second photoresist mask replicated therein, using at etch system which will also remove said second photoresist mask; and
   i) then etching said first and second layers of low k dielectric materials through said first and second hard masks to form a pattern of vias in said first layer of low k dielectric material and a pattern of trenches in said second layer of low k dielectric material;

whereby said pattern of via openings and said pattern of trench openings can be respectively formed in said layers of low k dielectric material without damage to said low k dielectric material during removal of said photoresist masks used respectively in the formation of said pattern of via openings and said pattern of trench openings.

2. The process of claim 1 wherein said first layer of low k dielectric material comprises low k carbon-doped silicon oxide dielectric material.

3. The process of claim 1 wherein said first hard mask comprises a dielectric material which will etch at a slower rate than said first low k dielectric material.

4. The process of claim 1 wherein said first hard mask comprises a dielectric material selected from the group consisting of silicon nitride and silicon carbide which will etch at a slower rate than said first low k dielectric material.

5. The process of claim 1 wherein said step of forming over said first hard mask layer a first photoresist mask having a pattern of via openings therein further comprises forming over said first hard mask layer a first photoresist mask which will etch at a faster rate than said first hard mask layer.

6. The process of claim 5 wherein the thicknesses of said first hard mask layer and said first photoresist mask are preselected to permit all of said first photoresist mask to be etched away prior to completion of the etch through said first hard mask layer to form said first hard (via) mask.

7. The process of claim 1 wherein said step of etching said first hard mask layer through said first photoresist mask to form a first hard mask having said pattern of vias openings in said first photoresist mask replicated therein, further comprises using an etch system which will remove all of said first photoresist mask prior to completion of the etch through said first hard mask layer to form said first hard (via) mask.

8. The process of claim 1 wherein the etchant system used to etch said first hard mask layer through said first photoresist mask to replicate said pattern of vias in said first hard mask comprises the same etchant system used to etch said first layer of low k material through said first hard mask.

9. The process of claim 8 wherein said etchant system used to etch said first hard mask layer through said first photoresist mask and to etch said first layer of low k material through said first hard mask comprises one or more fluorocarbons selected from the group consisting of $CF_4$, $CHF_3$, $CH_2F_2$, $CH_3F$, and combinations thereof.

10. The process of claim 1 wherein said second layer of low k dielectric material comprises low k carbon-doped silicon oxide dielectric material.

11. The process of claim 1 wherein said second hard mask comprises a dielectric material which will etch at a slower rate than said second low k dielectric material.

12. The process of claim 1 wherein second hard mask comprises a dielectric material selected from the group consisting of silicon nitride and silicon carbide which will etch at a slower rate than said second low k dielectric material.

13. The process of claim 1 wherein said step of forming over said second hard mask layer a second photoresist mask having a pattern of via openings therein further comprises forming over said second hard mask layer a second photoresist mask which will etch at a faster rate than said second hard mask layer.

14. The process of claim 13 wherein the thicknesses of said second hard mask layer and said second photoresist mask are preselected to permit all of said second photoresist mask to be etched away prior to completion of the etch through said second hard mask layer to form said second hard (trench) mask.

15. The process of claim 1 wherein said step of etching said second hard mask layer through said second photoresist mask to form a second hard mask having said pattern of trench openings in said second photoresist mask replicated therein, further comprises using an etch system which will remove all of said second photoresist mask prior to completion of the etch through said second hard mask layer to form said second hard (trench) mask.

16. The process of claim 1 wherein the etchant system used to etch said second hard mask layer through said second photoresist mask to replicate said pattern of trenches in said second hard mask comprises the same etchant system used to etch said second layer of low k material through said second hard mask.

17. The process of claim 16 wherein said etchant system used to etch said second hard mask layer through said second photoresist mask and to etch said second layer of low k material through said second hard mask comprises one or more fluorocarbons selected from the group consisting of $CF_4$, $CHF_3$, $CH_2F_2$, $CH_3F$, and combinations thereof.

18. The process of claim 1 wherein the thickness of said second hard mask is sufficient to permit etching of both said first low k layer and said second low k layer through said second hard mask.

19. The process of claim 1 wherein said first and second layers of low k material comprise the same carbon-doped silicon oxide dielectric material, whereby said first and second layers of low k dielectric material may be etched in the same etching step.

20. The process of claim 1 wherein said first and second layers of low k material each comprise a different carbon-doped silicon oxide dielectric material.

21. The process of claim 1 wherein said first and second hard mask layers each comprise the same dielectric material selected from the group consisting of silicon nitride and silicon carbide.

22. The process of claim 1 wherein one of said first and second hard mask layers comprises silicon nitride and the other of said first and second hard mask layers comprises silicon carbide, whereby said first and second hard mask layers may be etched separately.

23. A process for forming an integrated circuit structure comprising dual layers of low k carbon-doped silicon oxide dielectric material, with via openings and trench openings respectively formed in said dual layers while mitigating damage to said low k carbon-doped silicon oxide dielectric material, said process comprising:

a) forming a first layer of low k carbon-doped silicon oxide dielectric material on an integrated circuit structure;

b) forming over said first layer of low k dielectric material a first hard mask layer of dielectric material selected from the group consisting of silicon nitride and silicon carbide;

c) forming over said first hard mask layer a first photoresist mask having a pattern of via openings therein;

d) etching said first hard mask layer through said first photoresist mask to form a first hard mask having said pattern of vias openings in said first photoresist mask replicated therein, using an etch system which will also remove said first photoresist mask, said first photoresist mask having a faster etch rate than said first hard mask layer, whereby all of said first photoresist mask will be etched away prior to completion of said etch through said first hard mask layer;

e) forming a second layer of low k carbon-doped silicon oxide dielectric material over said first hard mask;

f) forming over said second layer of low k dielectric material a second hard mask layer of dielectric material selected from the group consisting of silicon nitride and silicon carbide;

g) forming over said second hard mask layer a second photoresist mask having a pattern of trench openings therein;

h) etching said second hard mask layer through said second photoresist resist mask to form a second hard mask having the pattern of trench openings in said second photoresist mask replicated therein, using at etch system which will also remove said second photoresist mask, said second photoresist mask having a faster etch rate than said second hard mask layer, whereby all of said second photoresist mask will be etched away prior to completion of said etch through said second hard mask layer; and i) then etching said first and second layers of low k dielectric materials through said first and second hard masks to form a pattern of vias in said first layer of low k dielectric material and a pattern of trenches in said second layer of low k dielectric material;

whereby said pattern of via openings and said pattern of trench openings can be respectively formed in said layers of low k dielectric material without damage to said low k dielectric material during removal of said photoresist masks used respectively in the formation of said pattern of via openings and said pattern of trench openings.

24. The process of claim 23 wherein the thicknesses of said first hard mask layer and said first photoresist mask are preselected to permit all of said first photoresist mask to be etched away prior to completion of the etch through said first hard mask layer to form said first hard (via) mask, whereby said etched portion of said first hard mask layer serves as a self-mask for the completion the remainder of the etching of said first hard mask layer to form said first hard (via) mask.

25. The process of claim 23 wherein the thicknesses of said second hard mask layer and said second photoresist mask are preselected to permit all of said second photoresist mask to be etched away prior to completion of the etch through said second hard mask layer to form said second hard (trench) mask, whereby said etched portion of said second hard mask layer serves as a self-mask for the completion the remainder of the etching of said second hard mask layer to form said second hard (trench) mask.

26. An integrated circuit structure comprising dual layers of low k carbon-doped silicon oxide dielectric material, with via openings and trench openings respectively formed in said dual layers while mitigating damage to said low k carbon-doped silicon oxide dielectric material, said dual layer structure of low k carbon-doped silicon oxide dielectric material with via openings and trench openings formed therein by:

a) forming a first layer of low k carbon-doped silicon oxide dielectric material on an integrated circuit structure;

b) forming over said first layer of low k dielectric material a first hard mask layer of dielectric material selected from the group consisting of silicon nitride and silicon carbide;

c) forming over said first hard mask layer a first photoresist mask having a pattern of via openings therein;

d) etching said first hard mask layer through said first photoresist mask to form a first hard mask having said pattern of vias openings in said first photoresist mask replicated therein, using an etch system which will also remove said first photoresist mask, said first photoresist mask having a faster etch rate than said first hard mask layer, whereby all of said first photoresist mask will be etched away prior to completion of said etch through said first hard mask layer;

e) forming a second layer of low k carbon-doped silicon oxide dielectric material over said first hard mask;

f) forming over said second layer of low k dielectric material a second hard mask layer of dielectric material selected from the group consisting of silicon nitride and silicon carbide;

g) forming over said second hard mask layer a second photoresist mask having a pattern of trench openings therein;

h) etching said second hard mask layer through said second photoresist resist mask to form a second hard mask having the pattern of trench openings in said second photoresist mask replicated therein, using an etch system which will also remove said second photoresist mask, said second photoresist mask having a faster etch rate than said second hard mask layer, whereby all of said second photoresist mask will be etched away prior to completion of said etch through said second hard mask layer; and i) then etching said first and second layers of low k dielectric materials through said first and second hard masks to form a pattern of vias in said first layer of low k dielectric material and a pattern of trenches in said second layer of low k dielectric material;

whereby said pattern of via openings and said pattern of trench openings can be respectively formed in said layers of low k dielectric material without damage to said low k dielectric material during removal of said photoresist masks used respectively in the formation of said pattern of via openings and said pattern of trench openings.

* * * * *